United States Patent
Kim et al.

(10) Patent No.: US 9,287,204 B2
(45) Date of Patent: Mar. 15, 2016

(54) SEMICONDUCTOR DEVICE AND METHOD OF BONDING SEMICONDUCTOR DIE TO SUBSTRATE IN RECONSTITUTED WAFER FORM

(71) Applicant: STATS ChipPAC, Ltd., Singapore (SG)

(72) Inventors: KyungMoon Kim, Gyeonggi-do (KR); KooHong Lee, Seoul (KR); JaeHak Yee, Seoul (KR); YoungChul Kim, Kyoungki-do (KR); Lan Hoang, San Jose, CA (US); Pandi C. Marimuthu, Singapore (SG); Steve Anderson, San Ramon, CA (US); HunTeak Lee, Gyeonggi-do (KR); HeeJo Chi, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 4 days.

(21) Appl. No.: 14/039,092

(22) Filed: Sep. 27, 2013

(65) Prior Publication Data

US 2014/0175640 A1    Jun. 26, 2014

Related U.S. Application Data

(60) Provisional application No. 61/740,404, filed on Dec. 20, 2012.

(51) Int. Cl.
*H01L 23/48* (2006.01)
*H01L 23/52* (2006.01)
(Continued)

(52) U.S. Cl.
CPC .... *H01L 23/49816* (2013.01); *H01L 23/49827* (2013.01); *H01L 24/97* (2013.01); *H01L 21/561* (2013.01); *H01L 21/565* (2013.01); *H01L 23/3128* (2013.01); *H01L 24/11* (2013.01);
(Continued)

(58) Field of Classification Search
USPC .................. 257/787–796, E23.001–E23.194, 257/678–733, 433; 438/127, 613, 26, 612
See application file for complete search history.

(56) References Cited

U.S. PATENT DOCUMENTS 4,509,994 A    4/1985 Barajas
5,172,851 A    12/1992 Matsushita et al.
(Continued)

OTHER PUBLICATIONS

DS Hi-Metal Beyond Materials, DSHM Epoxy Flux EFSCH-026, Technical Data Sheet, Rev2, Aug. 1, 2011, 1 page.
(Continued)

*Primary Examiner* — Dao H Nguyen
*Assistant Examiner* — Tram H Nguyen
(74) *Attorney, Agent, or Firm* — Robert D. Atkins; Atkins and Associates, P.C.

(57) ABSTRACT

A semiconductor device has a plurality of semiconductor die disposed over a carrier. An electrical interconnect, such as a stud bump, is formed over the semiconductor die. The stud bumps are trimmed to a uniform height. A substrate includes a bump over the substrate. The electrical interconnect of the semiconductor die is bonded to the bumps of the substrate while the semiconductor die is disposed over the carrier. An underfill material is deposited between the semiconductor die and substrate. Alternatively, an encapsulant is deposited over the semiconductor die and substrate using a chase mold. The bonding of stud bumps of the semiconductor die to bumps of the substrate is performed using gang reflow or thermocompression while the semiconductor die are in reconstituted wafer form and attached to the carrier to provide a high throughput of the flipchip type interconnect to the substrate.

25 Claims, 13 Drawing Sheets

(51) Int. Cl.
*H01L 29/40* (2006.01)
*H01L 23/498* (2006.01)
*H01L 23/00* (2006.01)
*H01L 23/31* (2006.01)
*H01L 21/56* (2006.01)

(52) U.S. Cl.
CPC ............... *H01L24/13* (2013.01); *H01L 24/81* (2013.01); *H01L 24/83* (2013.01); *H01L 2224/0401* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/11002* (2013.01); *H01L 2224/1134* (2013.01); *H01L 2224/13023* (2013.01); *H01L 2224/13124* (2013.01); *H01L 2224/13139* (2013.01); *H01L 2224/13144* (2013.01); *H01L 2224/13147* (2013.01); *H01L 2224/16225* (2013.01); *H01L 2224/16227* (2013.01); *H01L 2224/2919* (2013.01); *H01L 2224/73204* (2013.01); *H01L 2224/7598* (2013.01); *H01L 2224/81005* (2013.01); *H01L 2224/81193* (2013.01); *H01L 2224/81203* (2013.01); *H01L 2224/81815* (2013.01); *H01L 2224/83102* (2013.01); *H01L 2224/83192* (2013.01); *H01L 2224/97* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 5,346,118 A | 9/1994 | Degani et al. | |
| 5,564,617 A | 10/1996 | Degani et al. | |
| 5,817,545 A | 10/1998 | Wang et al. | |
| 6,324,069 B1 | 11/2001 | Weber | |
| 7,087,458 B2 | 8/2006 | Wang et al. | |
| 8,071,470 B2 | 12/2011 | Khor et al. | |
| 2004/0238948 A1* | 12/2004 | Shiozawa | H01L 23/3114 257/723 |
| 2007/0001277 A1* | 1/2007 | Ichikawa | H01L 23/49827 257/676 |
| 2008/0258284 A1* | 10/2008 | Trezza | H01L 21/561 257/685 |
| 2009/0102037 A1* | 4/2009 | Kim | H01L 23/49827 257/686 |
| 2009/0206480 A1 | 8/2009 | Lam | |
| 2010/0007001 A1* | 1/2010 | Wang | H01L 23/481 257/686 |
| 2010/0072456 A1* | 3/2010 | Weston | H01S 5/0262 257/13 |
| 2010/0140771 A1* | 6/2010 | Huang | H01L 21/6835 257/686 |
| 2011/0068459 A1* | 3/2011 | Pagaila | H01L 21/56 257/698 |
| 2011/0084386 A1* | 4/2011 | Pendse | H01L 23/3178 257/737 |
| 2011/0115070 A1* | 5/2011 | Lim | H01L 21/563 257/698 |
| 2011/0241025 A1* | 10/2011 | Sakamoto | H01L 33/486 257/88 |
| 2011/0285006 A1* | 11/2011 | Weng | H01L 23/13 257/686 |
| 2011/0285007 A1* | 11/2011 | Chi | H01L 21/4846 257/686 |
| 2012/0104590 A1* | 5/2012 | Do | H01L 25/16 257/690 |
| 2012/0119388 A1* | 5/2012 | Cho | H01L 21/56 257/778 |
| 2012/0241955 A1 | 9/2012 | Law et al. | |
| 2013/0032946 A1* | 2/2013 | West | H01L 21/78 257/774 |

OTHER PUBLICATIONS

DS Hi-Metal Beyond Materials, Epoxy Flux Introduction, pp. 1-33.
Alpha Advanced Materials, Low Temperature Processing, ALPHA Low Temperature SMT (Surface Mount Technology) Soldering/Processing, Webpage, http://alphacpmd.com/Products/Solder-Paste/Low-Temperature-Processing, 2013. pp. 1-3.
Superior Flux & Mfg. Co., Material Safety Data Sheet, Superior No. 1265 Paste, Jan. 1, 2012, pp. 1-3.
Superior Flux & Mfg. Co., Superior 1265, Aluminum Paste Flux, 1 page.
Superior Flux & Mfg. Co., Material Safety Data Sheet, Superior AL26-33-75, May 24, 2012, pp. 1-4.
Superior Flux & Mfg. Co., Superior Solder Paste AL-26-33-75, Direct Aluminum Solderpaste Using SN96.5/AG3.5, pp. 1-2.
Avery, William F., Direct Aluminum Soldering Paste, IMAPS Thermal Management 2011 Workshop.
Air Products, Better Process Solutions for Direct Benefits at Test & Assembly, Sep. 13, 2010, pp. 1-24.

\* cited by examiner

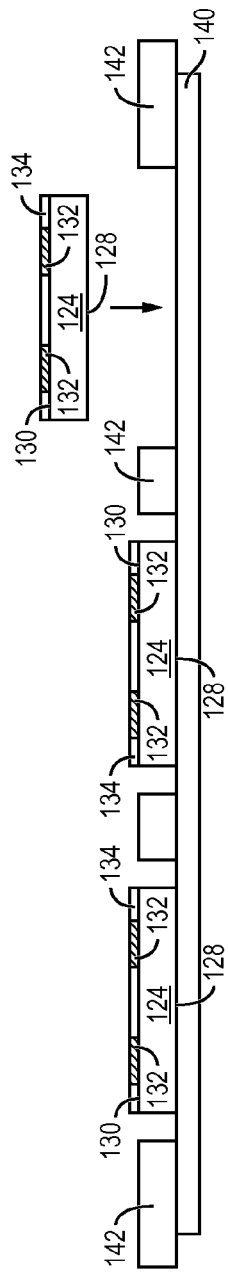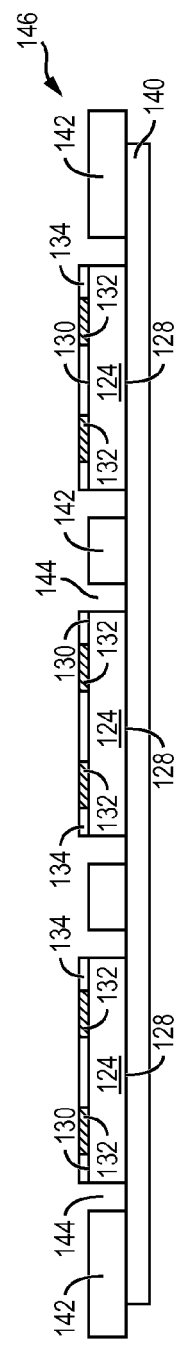

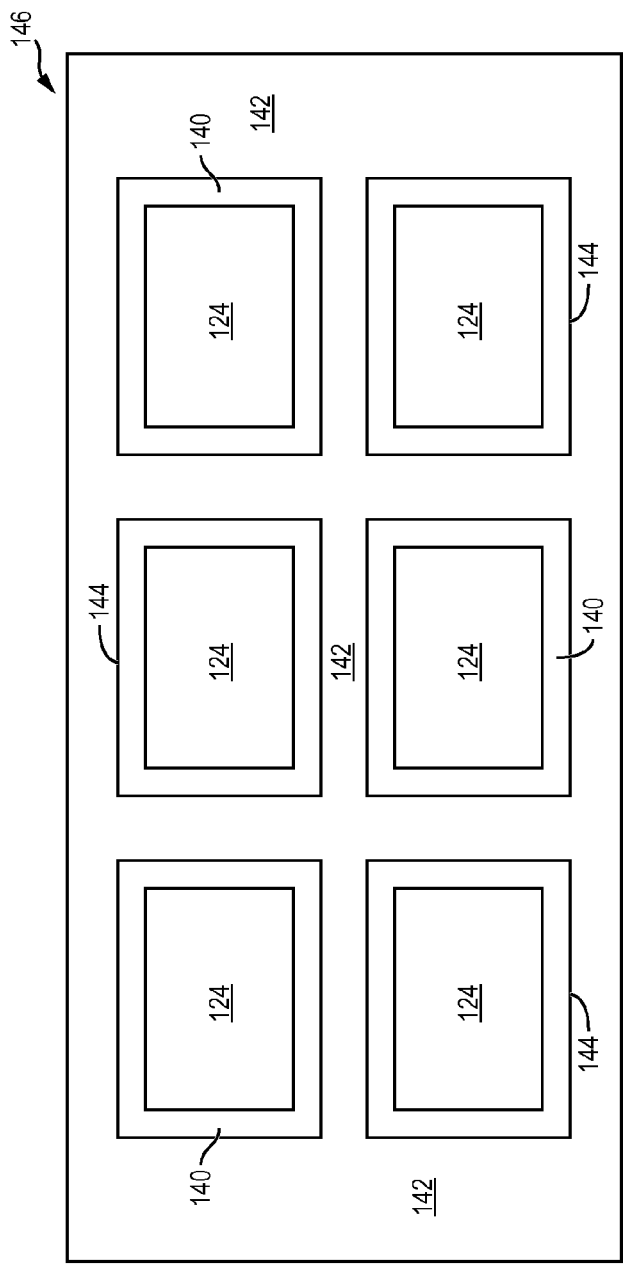
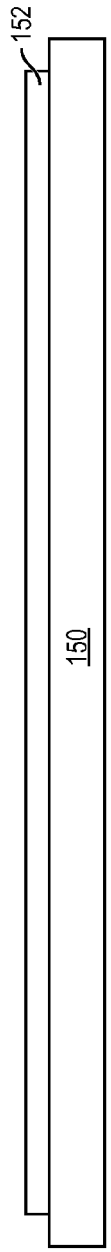
FIG. 4d
FIG. 4e

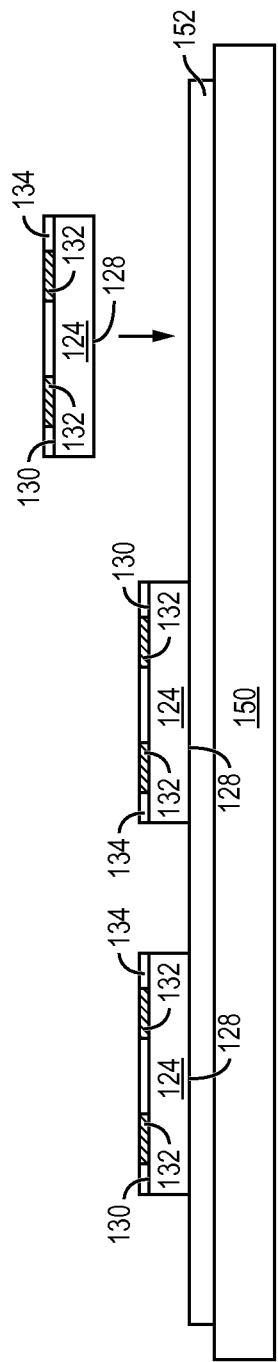
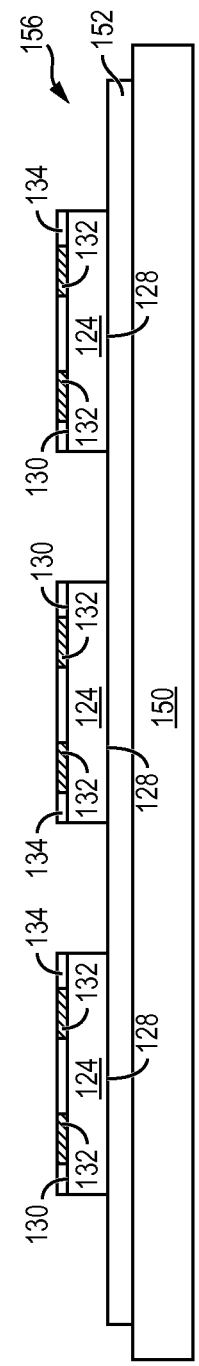
FIG. 4f
FIG. 4g

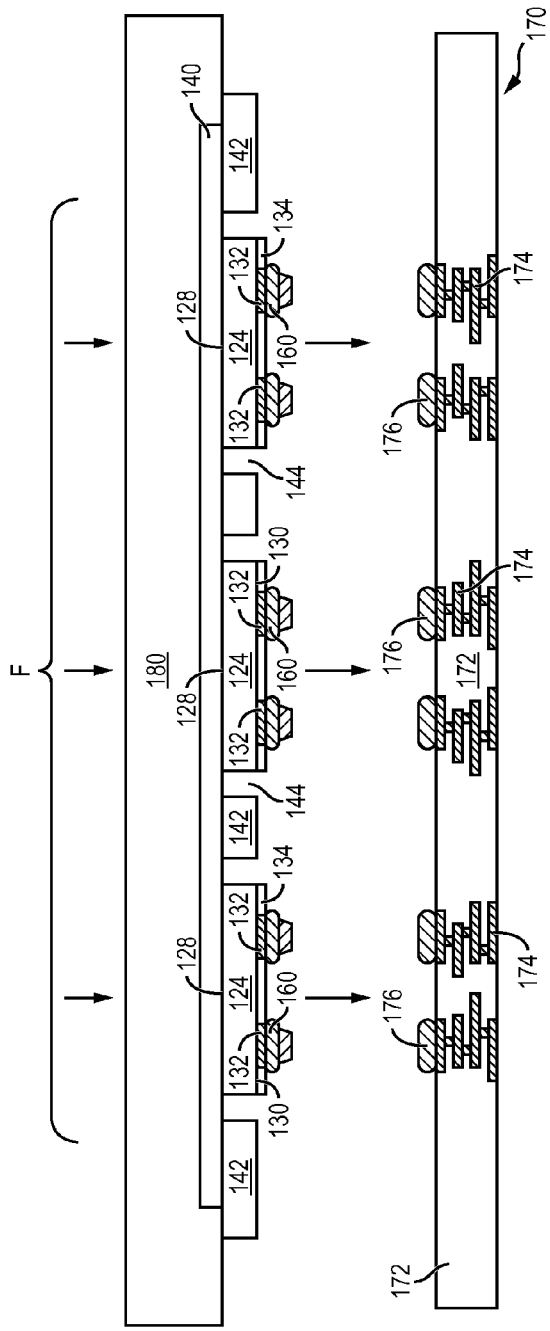
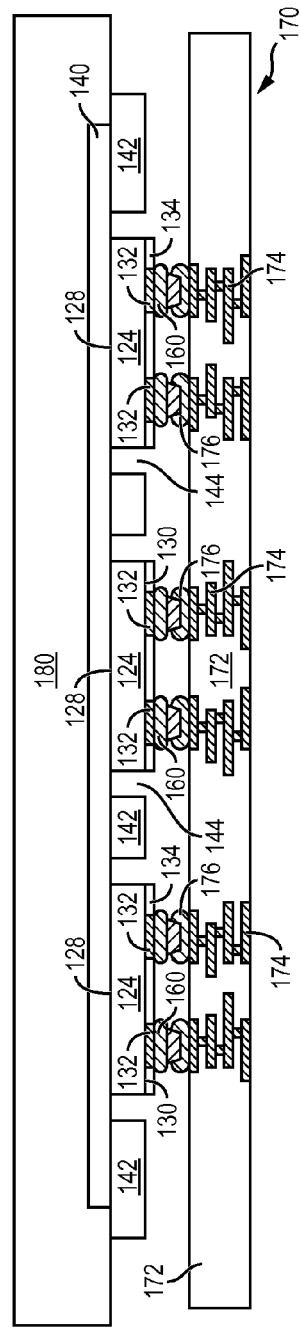
FIG. 4k
FIG. 4l

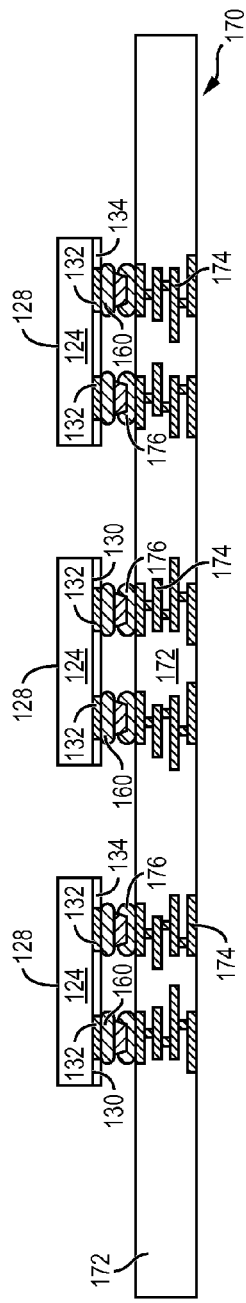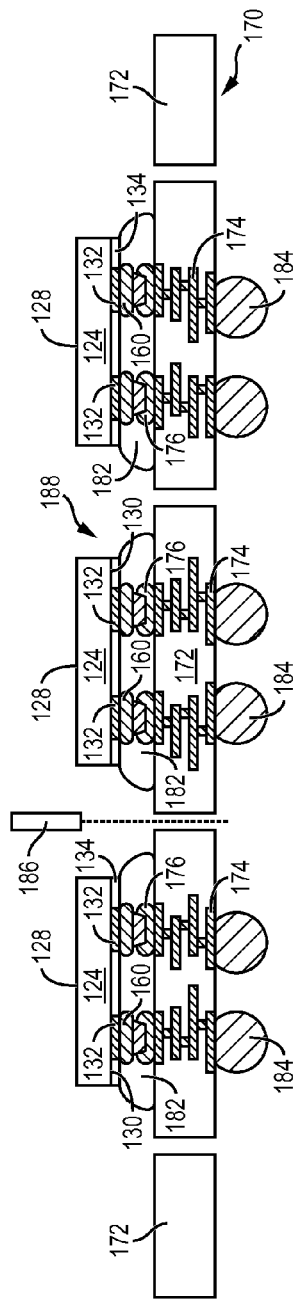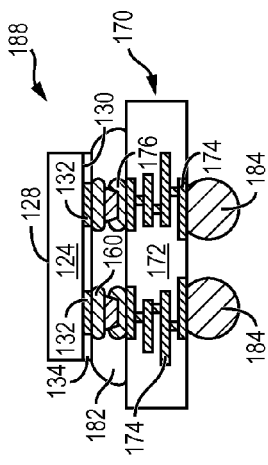

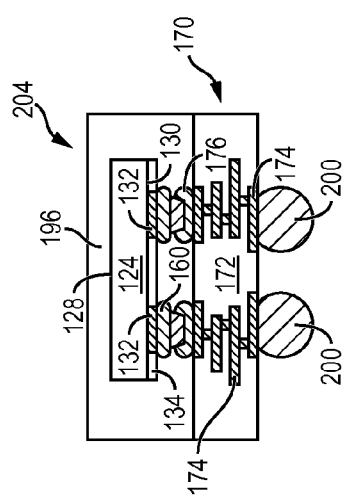
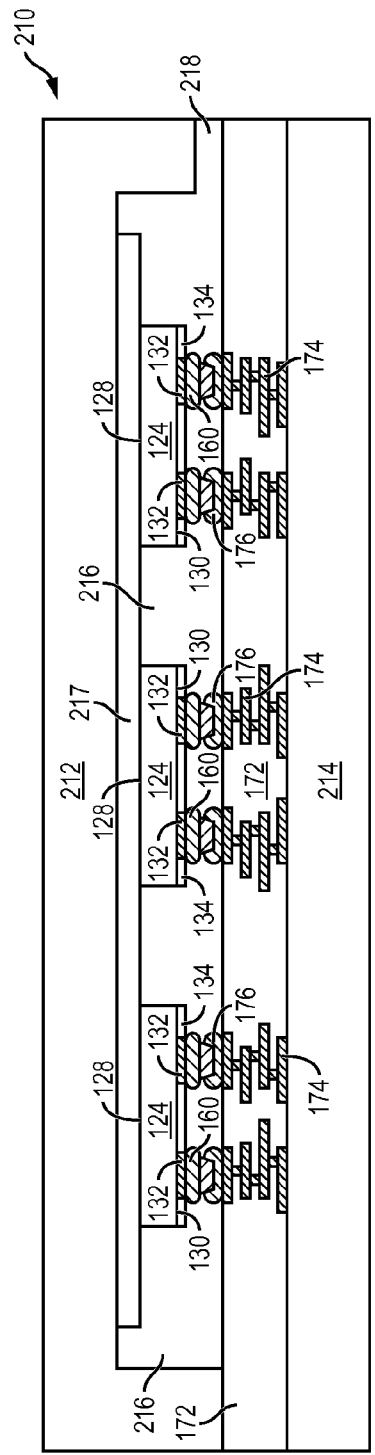

US 9,287,204 B2

SEMICONDUCTOR DEVICE AND METHOD OF BONDING SEMICONDUCTOR DIE TO SUBSTRATE IN RECONSTITUTED WAFER FORM

CLAIM TO DOMESTIC PRIORITY

The present application claims the benefit of U.S. Provisional Application No. 61/740,404, filed Dec. 20, 2012, which application is incorporated herein by reference.

FIELD OF THE INVENTION

The present invention relates in general to semiconductor devices and, more particularly, to a semiconductor device and method of bonding a semiconductor die to a substrate while in reconstituted wafer form and attached to a carrier.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

In manufacture of a semiconductor package, an individual semiconductor die, such as a flipchip type die, is commonly mounted to a substrate. An electrical interconnect, such as a stud bump, can be formed on the semiconductor die either at the wafer level or individual die level. Achieving uniform height of the stud bumps can be difficult, particularly when formed at the wafer level. The stud bump must then be bonded to an interconnect site on the substrate. The bonding of individual semiconductor die to the substrate involves meticulous handling of the die and substrate and results in a low production throughput and higher defect rate.

SUMMARY OF THE INVENTION

A need exists to bond a semiconductor die to a substrate in a manner to achieve high production throughput and low defect rate. Accordingly, in one embodiment, the present invention is a method of making a semiconductor device comprising the steps of providing a plurality of semiconductor die, providing a carrier, disposing the semiconductor die over the carrier, providing a substrate, and bonding the semiconductor die to the substrate while disposed over the carrier.

In another embodiment, the present invention is a method of making a semiconductor device comprising the steps of providing a plurality of semiconductor die, providing a carrier, disposing the semiconductor die over the carrier, and forming an electrical interconnect over the semiconductor die while disposed over the carrier.

In another embodiment, the present invention is a semiconductor device comprising a carrier and plurality of semiconductor die disposed over the carrier. The semiconductor die is bonded to a substrate while disposed over the carrier.

In another embodiment, the present invention is a semiconductor device comprising a carrier and plurality of semiconductor die disposed over the carrier. An electrical interconnect is formed over the semiconductor die while disposed over the carrier.

BRIEF DESCRIPTION OF THE DRAWINGS

FIG. 5 illustrates a flipchip semiconductor package after singulation from the reconstituted wafer of FIGS. 4a-4n;

FIG. 7 illustrates a flipchip semiconductor package after singulation from the reconstituted wafer of FIGS. 6a-6b;

FIGS. 8a-8b illustrate another mold underfill of the semiconductor die and substrate while in reconstituted wafer form with the die attached to the carrier.

DETAILED DESCRIPTION OF THE DRAWINGS

Figure 1:
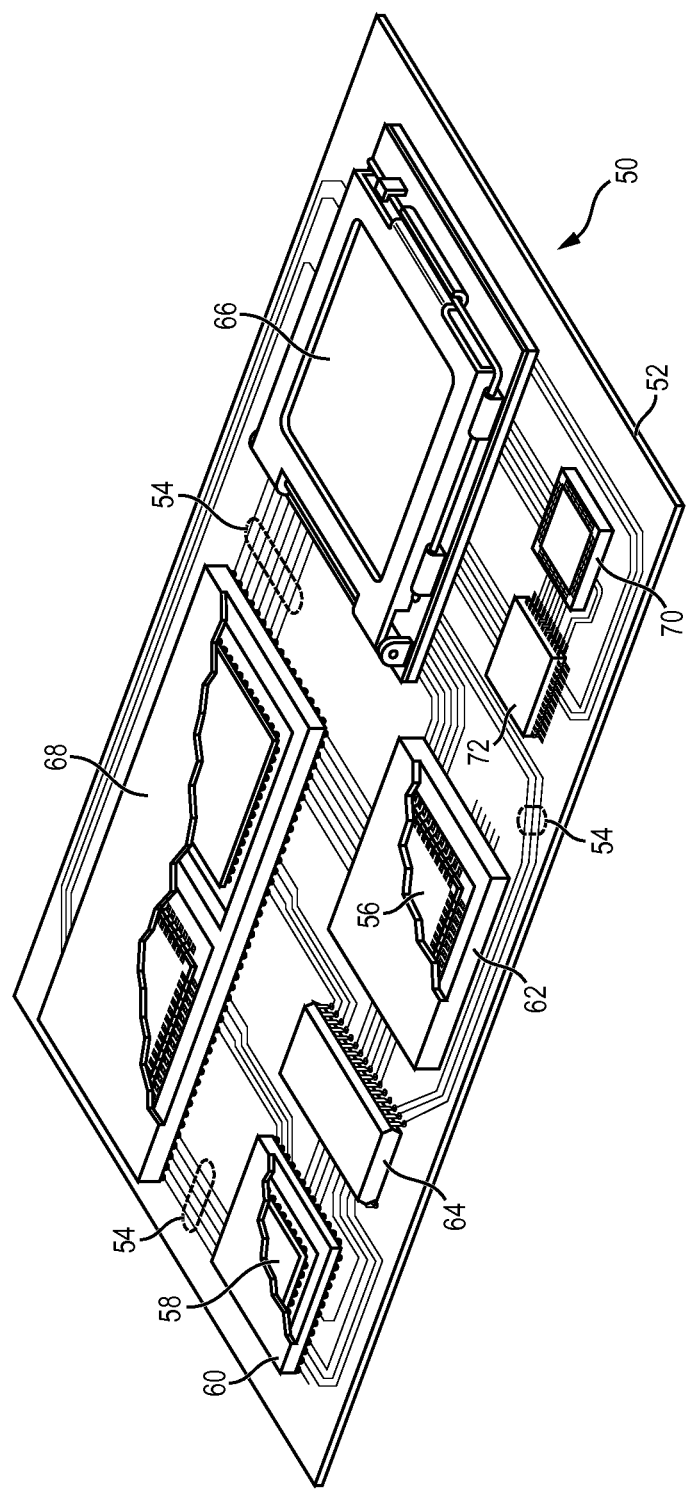
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
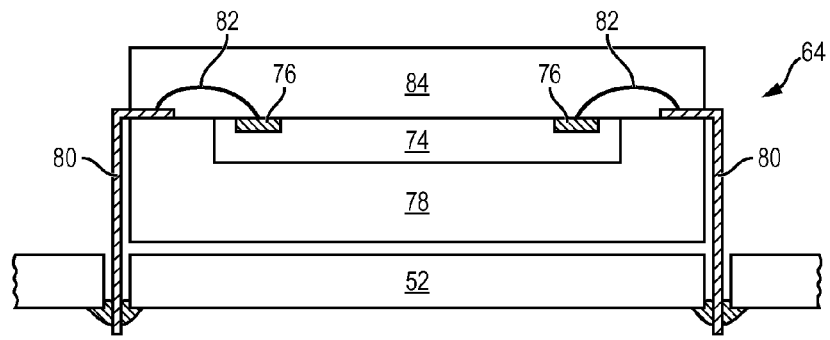
FIGS. 2a-2c illustrate further detail of the representative semiconductor packages mounted to the PCB.
Figure 2B:
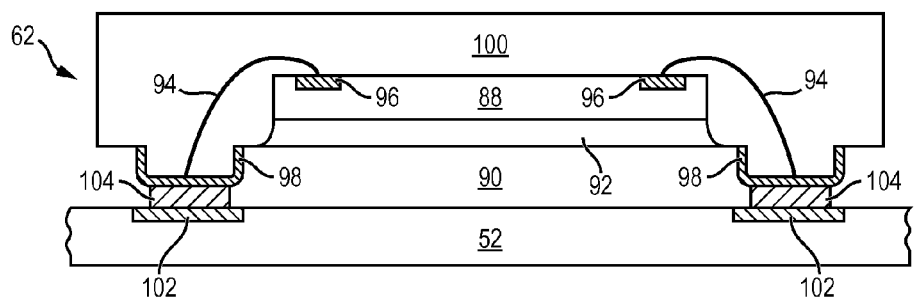
Figure 2C:
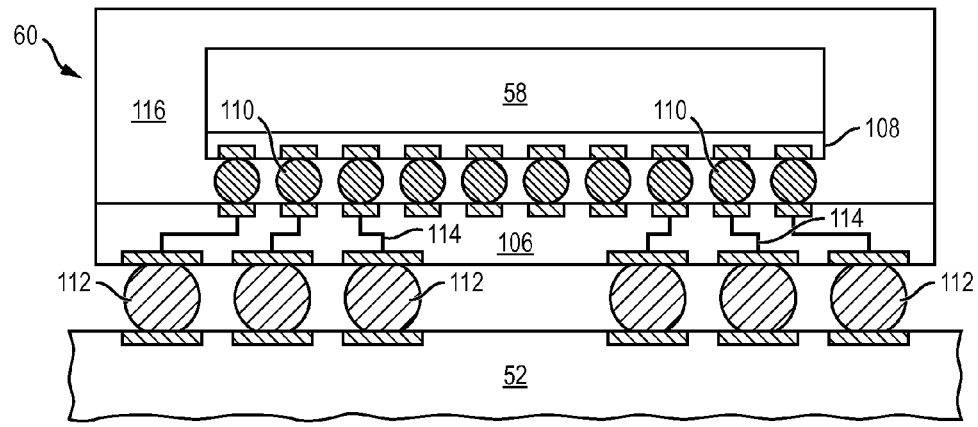

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
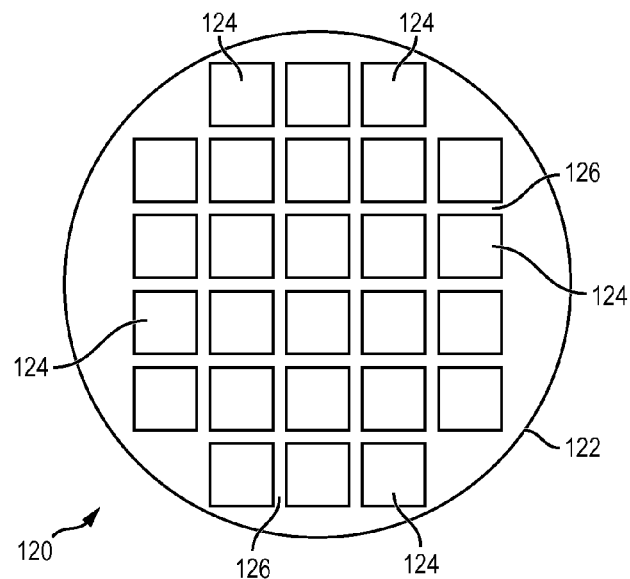
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
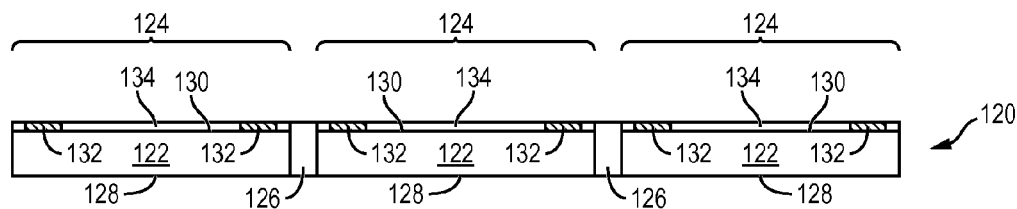

FIG. 3b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 using PVD, CVD, printing, lamination, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Alternatively, insulating layer 134 can be formed before conductive layer 132. A portion of insulating layer 134 would be removed by an etching process or laser direct ablation (LDA) to expose active surface 130 and form conductive layer 132.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 132 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, electrostatic discharge (ESD), radio frequency (RF) performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 3C:
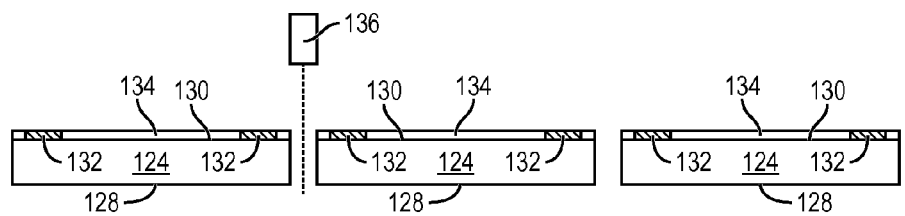

In FIG. 3c, semiconductor wafer 120 is singulated through saw street 126 using a saw blade or laser cutting tool 136 into individual semiconductor die 124. The individual semiconductor die 124 can be inspected and electrically tested for identification of KGD post singulation.

FIGS. 4a-4n illustrate, in relation to FIGS. 1 and 2a-2c, a process of bonding a semiconductor die to a substrate while the die is attached to a carrier. FIG. 4a shows a cross-sectional view of a portion of a carrier or temporary substrate 140. In one embodiment, carrier 140 is a tape. A carrier frame 142 is positioned over carrier 140 and secured to the carrier with an adhesive layer. Carrier 140 and/or carrier frame 142 contain sacrificial base material such as silicon, polymer, beryllium oxide, glass, or other suitable low-cost, rigid material for structural support. Carrier frame 142 includes openings 144 for alignment and placement of semiconductor die 124 over carrier 140.

In FIG. 4b, semiconductor die 124 from FIG. 3c are mounted within openings 144 of carrier frame 142 to carrier 140 using, for example, a pick and place operation with back surface 128 oriented toward the carrier. FIG. 4c shows semiconductor die 124 mounted within openings 144 of carrier frame 142 to carrier 140 with an adhesive layer as reconstituted or reconfigured wafer 146. FIG. 4d shows a plan view of semiconductor die 124 mounted within openings 144 of carrier frame 142 to carrier 140 as reconstituted wafer 146.

In another embodiment, FIG. 4e shows a cross-sectional view of a portion of a carrier frame 150. A carrier tape 152 is formed over carrier frame 150. Carrier frame 150 and/or carrier tape 152 contain sacrificial base material such as silicon, polymer, beryllium oxide, glass, or other suitable low-cost, rigid material for structural support.

Figure 4H:
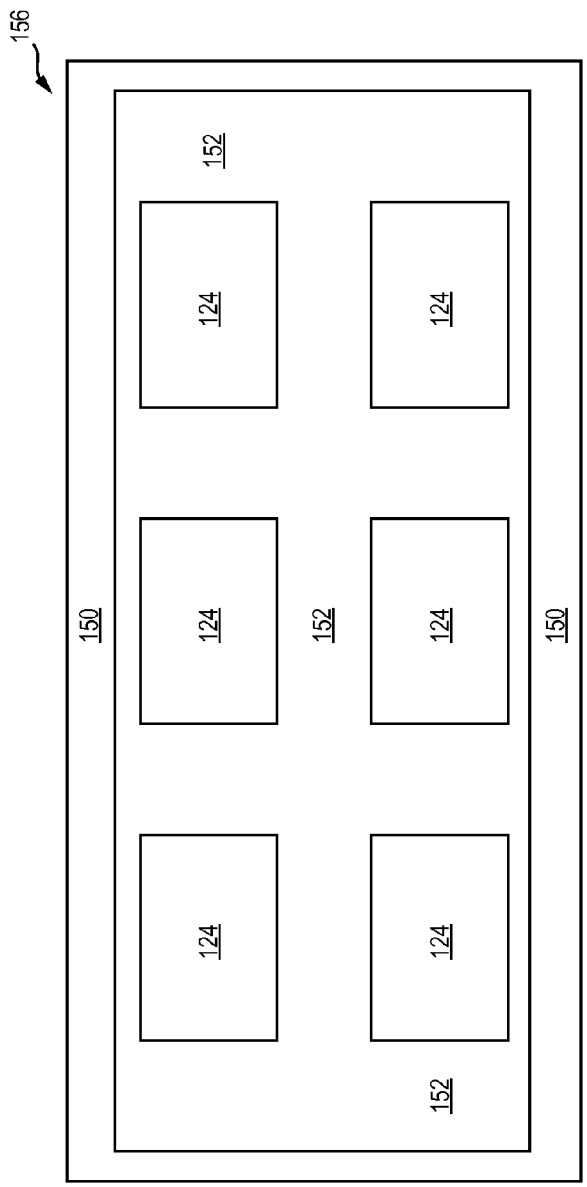
FIGS. 4a-4n illustrate a process of bonding a semiconductor die to a substrate while in reconstituted wafer form with the die attached to the carrier.

In FIG. 4f, semiconductor die 124 from FIG. 3c are mounted over carrier tape 152 and carrier frame 150 using, for example, a pick and place operation with back surface 128 oriented toward the carrier tape. FIG. 4g shows semiconductor die 124 mounted to carrier tape 152 and carrier frame 150 with an adhesive layer as reconstituted or reconfigured wafer 156. FIG. 4h shows a plan view of semiconductor die 124 mounted to carrier tape 152 and carrier frame 150 as reconstituted wafer 156.

Carrier structures 140-142 and 150-152 can be a round or rectangular panel (greater than 300 mm) with capacity for multiple semiconductor die 124. Carriers 140-142 and 150-152 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carriers 140-142 and 150-152 is selected independent of the size of semiconductor die 124 or size of semiconductor wafer 120. That is, carriers 140-142 and 150-152 have a fixed or standardized size, which can accommodate various size semiconductor die 124 singulated from one or more semiconductor wafers 120. In one embodiment, carriers 140-142 and 150-152 are circular with a diameter of 330 mm. In another embodiment, carriers 140-142 and 150-152 are rectangular with a width of 560 mm and length of 600 mm. Semiconductor die 124 may have dimensions of 10 mm by 10 mm, which are placed on the standardized carrier 140-142 or 150-152. Alternatively, semiconductor die 124 may have dimensions of 20 mm by 20 mm, which are placed on the same standardized carrier 140-142 or 150-152. Accordingly, standardized carrier 140-142 or 150-152 can handle any size semiconductor die 124, which allows subsequent semiconductor processing equipment to be standardized to a common carrier, i.e., independent of die size or incoming wafer size. Semiconductor packaging equipment can be designed and configured for the standard carrier using a common set of processing tools, equipment, and bill of materials to process any semiconductor die size from any incoming wafer size. The common or standardized carrier 140-142 or 150-152 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Reconstituted wafers 146 and 156 can be processed into many types of semiconductor packages, including flipchip packages, embedded wafer level ball grid array (eWLB), fan-in wafer level chip scale packages (WLCSP), reconstituted or embedded wafer level chip scale packages (eWLCSP), fan-out WLCSP, three dimensional (3D) packages, such as package-on-package (PoP), or other semiconductor packages. Reconstituted wafers 146 and 156 are configured according to the specifications of the resulting semiconductor package. In one embodiment, semiconductor die 124 are placed on carrier 140-142 or 150-152 in a high-density arrangement, i.e., 300 micrometers (μm) apart or less, for processing fan-in devices. In another embodiment, semiconductor die 124 are separated by a distance of 50 μm on carrier 140-142 or 150-152. The distance between semiconductor die 124 on carrier 140-142 or 150-152 is optimized for manufacturing the semiconductor packages at the lowest unit cost. The larger surface area of carrier 140-142 or 150-152 accommodates more semiconductor die 124 and lowers manufacturing cost as more semiconductor die 124 are processed per reconstituted wafer 146 or 156. The number of semiconductor die 124 mounted to carrier 140-142 or 150-152 can be greater than the number of semiconductor die 124 singulated from semiconductor wafer 120. Carriers 140-142 and 150-152 and reconstituted wafers 146 and 156 provide the flexibility to manufacture many different types of semiconductor packages using different size semiconductor die 124 from different sized semiconductor wafers 120.

Figure 4I:
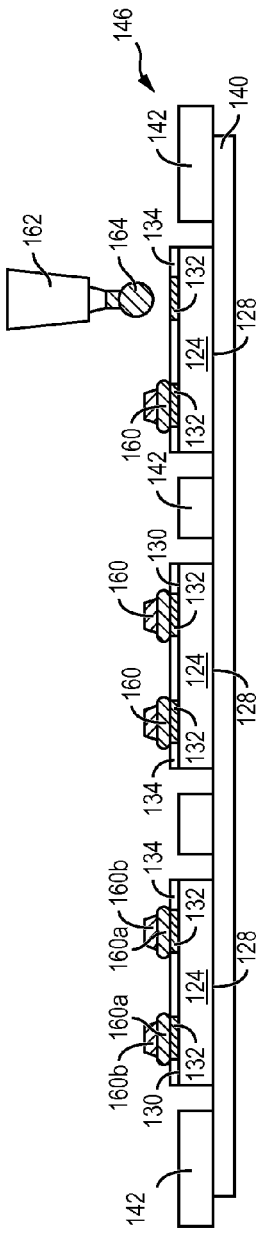
Figure 4J:
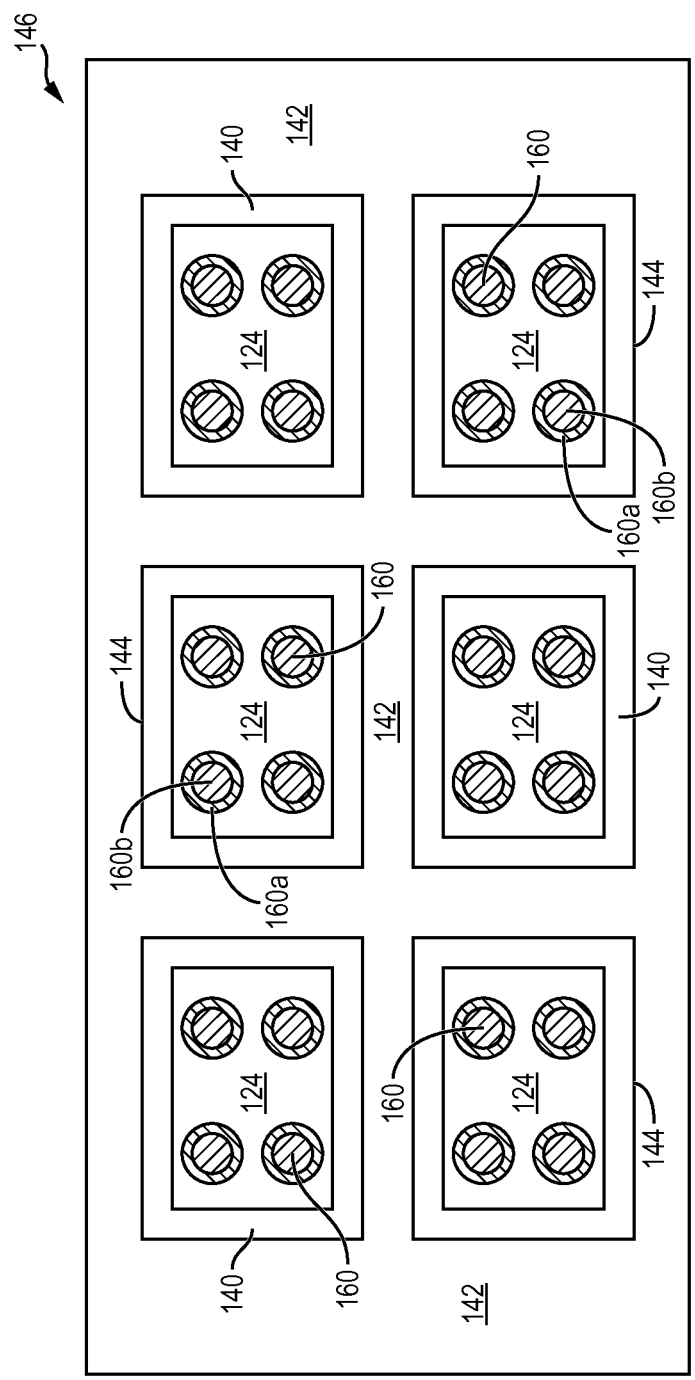

The remaining discussion is directed to reconstituted wafer 146 containing semiconductor die 124 mounted to carrier 140 and carrier frame 142, although the same principles apply to reconstituted wafer 156 containing semiconductor die 124 mounted to carrier frame 150 and carrier tape 152. Continuing from FIG. 4c, a plurality of electrical interconnects or stud bumps 160 are formed over conductive layer 132 of semiconductor die 124 while in reconstituted wafer form with the semiconductor die attached to carrier 140 and carrier frame 142, as shown in FIG. 4i. Stud bumps 160 include a base portion 160a and stem portion 160b. Conductive material 164, such as Au, Ag, Cu, Al, or alloy thereof, is dispensed or extruded from applicator 162 to form stud bumps 160. Stud bumps 160 are trimmed, cut, planarized, or otherwise leveled to a desired uniform height, such as 10-100 μm. FIG. 4j shows a plan view of stud bumps 160 formed over conductive layer 132 of semiconductor die 124 disposed within openings 144 of carrier frame 142 over carrier 140.

FIG. 4k shows substrate or PCB 170 containing insulating material 172 and conductive layers 174. In one embodiment, substrate 170 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 170 can also be a multi-layer flexible laminate, ceramic, copper foil, glass, or semiconductor wafer including an active surface containing one or more transistors, diodes, and other circuit elements to implement analog circuits or digital circuits. The insulating material 172 may contain one or more layers of $SiO_2$, $Si_3N_4$, SiON, $Ta_2O_5$, $Al_2O_3$, hafnium oxide ($HfO_2$), benzocyclobutene (BCB), polyimide (PI), polybenzoxazoles (PBO), polymer, or other dielectric material having similar structural and insulating properties. Conductive layers 174 contain Al, Cu, Sn, Ni, Au, Ag, Ti, W, or other suitable electrically conductive material formed using a patterning and metal deposition process such as sputtering, electrolytic plating, and electroless plating. Conductive layers 174 include lateral redistribution layers (RDL) and vertical conductive vias to provide electrical interconnect through substrate 170. Portions of conductive layers 174 are electrically common or electrically isolated according to the design and function of the semiconductor die 124 mounted to substrate 170.

An electrically conductive bump material is deposited over conductive layer 174 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 174 using a suitable attachment or bonding process. In one embodiment, the bump material is reflowed by heating the material above its melting point to form balls or bumps 176. In some applications, bumps 176 are reflowed a second time to improve electrical contact to conductive layer 174. Bumps 176 can also be compression bonded or thermocompression bonded to conductive layer 174. Bumps 176 represent one type of interconnect structure that can be formed over conductive layer 174. The interconnect structure can also use conductive paste, stud bump, micro bump, or other electrical interconnect.

Heat tip 180 is mounted to carrier 140 and carrier frame 142 of reconstituted wafer 146 for bonding of stud bumps 160 to bumps 176 of substrate 170. Reconstituted wafer 146 is positioned over substrate 170 with stud bumps 160 aligned to bumps 176. Stud bumps 160 are brought into contact with bumps 176 to form an electrical and metallurgical union using gang reflow or thermocompression bonding with the aid of heat tip 180. Heat tip 180 applies a force F under an elevated temperature for the reflow or thermocompression bonding of stud bumps 160 to bumps 176. FIG. 4l shows stud bumps 160 electrically and metallurgically bonded to bumps 176. The bonding of stud bumps 160 of semiconductor die 124 to bumps 176 of substrate 170 is performed using gang reflow or thermocompression while the semiconductor die are in reconstituted wafer form and attached to carrier 140 and carrier frame 142 (or carrier frame 150 and carrier tape 152) to provide a high throughput of the flipchip type interconnect to the substrate.

In FIG. 4m, heat tip 180 is removed, as well as carrier 140 and carrier frame 142, by chemical etching, mechanical peeling, chemical mechanical planarization (CMP), mechanical grinding, thermal bake, UV light, laser scanning, or wet stripping to expose back surface 128 of semiconductor die 124.

In FIG. 4n, an underfill material 182, such as epoxy resin, is deposited between semiconductor die 124 and substrate 170. Underfill material 182 can be deposited by a capillary underfill process. Alternatively, a non-conductive paste or non-conductive film can be applied to substrate 170 prior to attaching semiconductor die 124. Bumps 184 are formed over conductive layer 174 on a surface of substrate 170 opposite semiconductor die 124. Semiconductor die 124 are singulated through substrate 170 with saw blade or laser cutting tool 186 into individual flipchip packages 188.

FIG. 5 shows flipchip package 188 after singulation. Semiconductor die 124 is electrically connected through stud bumps 160 and bumps 176 to conductive layer 174 and bumps 184 of substrate 170 for external interconnect. The bonding of stud bumps 160 of semiconductor die 124 to bumps 176 of substrate 170 is performed using gang reflow or thermocompression while the semiconductor die are in reconstituted wafer form and attached to carrier 140 and carrier frame 142 (or carrier frame 150 and carrier tape 152) to provide a high throughput of the flipchip type interconnect to the substrate. The flipchip package 188 may undergo inspection and electrical testing before or after singulation.

Figure 6A:
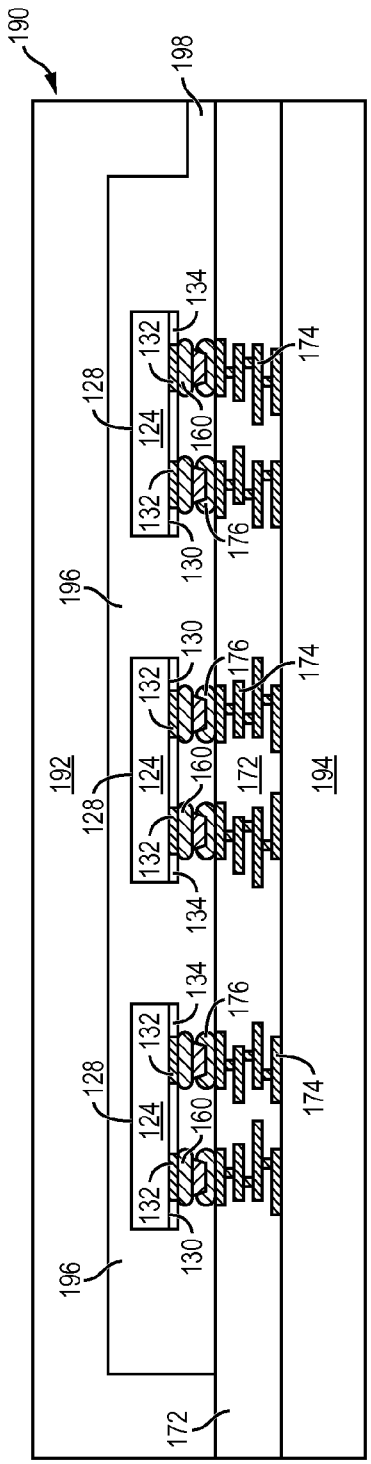
FIGS. 6a-6b illustrate a mold underfill of the semiconductor die and substrate while in reconstituted wafer form with the die attached to the carrier.

In another embodiment, continuing from FIG. 4m, semiconductor die 124 and substrate 170 are placed in chase mold 190, as shown in FIG. 6a. Chase mold 190 includes an upper mold support 192 and lower mold support 194. Upper mold support 192 has a cavity for containing semiconductor die 124, substrate 170, and encapsulant or molding compound. Semiconductor die 124 and substrate 170 are placed over lower mold support 194 with a surface of the substrate, opposite the semiconductor die, contacting the lower mold support. The upper mold support 192 and lower mold support 194 are brought together to close chase mold 190. A volume of encapsulant or molding compound 196 is injected under an elevated temperature and pressure through inlet 198 to cover semiconductor die 124 and substrate 170. Encapsulant 196 can be a polymer composite material, such as epoxy resin with filler, epoxy acrylate with filler, or polymer with proper filler. In particular, encapsulant 196 covers the four side surfaces, back surface 128 of semiconductor die 124, and an area between the semiconductor die and substrate. The volume of encapsulant 196 is measured according to the space requirements of the chase mold cavity less the area occupied by semiconductor die 124 and substrate 170. Encapsulant 196 is evenly dispersed and uniformly distributed under an elevated temperature within chase mold 190 around and between semiconductor die 124 and substrate 170. In one embodiment, the molding temperature ranges from 80-150° C. with a molding time of 250-1000 seconds. The molding cure temperature ranges from 100-180° C. with a molding cure time of 20-120 minutes. Encapsulant 196 is non-conductive and environmentally protects the semiconductor device from external elements and contaminants.

Figure 6B:
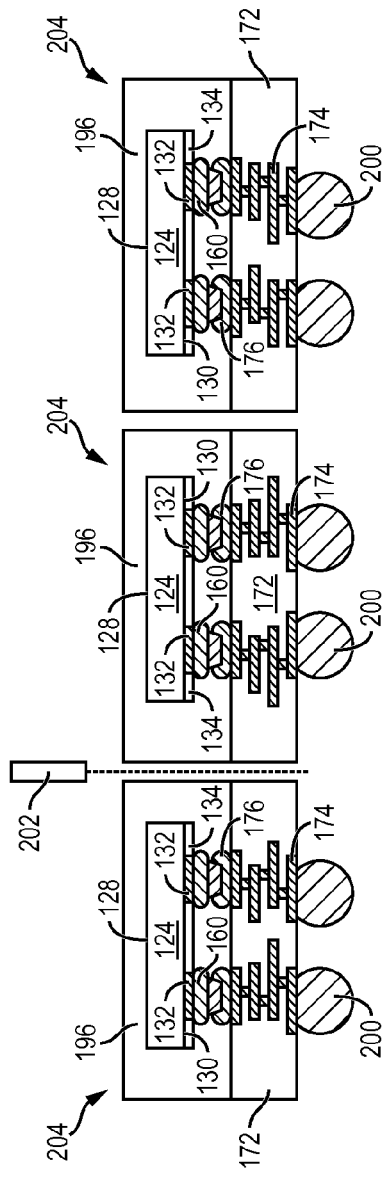

In FIG. 6b, semiconductor die 124 and substrate 170 are removed from chase mold 190. Bumps 200 are formed over conductive layer 174 on a surface of substrate 170 opposite semiconductor die 124. Semiconductor die 124 are singulated through substrate 170 with saw blade or laser cutting tool 202 into individual flipchip packages 204.

FIG. 7 shows flipchip package 204 after singulation. Semiconductor die 124 is electrically connected through stud bumps 160 and bumps 176 to conductive layer 174 and bumps 200 of substrate 170 for external interconnect. The bonding of stud bumps 160 of semiconductor die 124 to bumps 176 of substrate 170 is performed using gang reflow or thermocompression while the semiconductor die are in reconstituted wafer form and attached to carrier 140 and carrier frame 142 (or carrier frame 150 and carrier tape 152) to provide a high throughput of the flipchip type interconnect to the substrate. The flipchip package 204 may undergo inspection and electrical testing before or after singulation.

In another embodiment, continuing from FIG. 4m, semiconductor die 124 and substrate 170 are placed in chase mold 210, as shown in FIG. 8a. Chase mold 210 includes an upper mold support 212 and lower mold support 214. Upper mold support 212 has a cavity for containing semiconductor die 124, substrate 170, and encapsulant or molding compound. Semiconductor die 124 and substrate 170 are placed over lower mold support 214 with a surface of the substrate, opposite the semiconductor die, contacting the lower mold support. The upper mold support 212 and lower mold support 214 are brought together to close chase mold 210. Back surface 128 of semiconductor die 124 contacts sealing layer 217 of upper mold support 212 to block formation of encapsulant 216 over the back surface of the semiconductor die. A volume of encapsulant or molding compound 216 is injected under an elevated temperature and pressure through inlet 218 to cover semiconductor die 124 and substrate 170. Encapsulant 216 can be a polymer composite material, such as epoxy resin with filler, epoxy acrylate with filler, or polymer with proper filler. In particular, encapsulant 216 covers the four side surfaces of semiconductor die 124, as well as between the semiconductor die and substrate. Back surface 128 remains devoid of encapsulant 216. The volume of encapsulant 216 is measured according to the space requirements of the chase mold cavity less the area occupied by semiconductor die 124 and substrate 170. Encapsulant 216 is evenly dispersed and uniformly distributed under an elevated temperature within chase mold 210 around semiconductor die 124. In one embodiment, the molding temperature ranges from 80-150° C. with a molding time of 250-1000 seconds. The molding cure temperature ranges from 100-180° C. with a molding cure time of 20-120 minutes. Encapsulant 216 is non-conductive and environmentally protects the semiconductor device from external elements and contaminants.

Figure 8B:
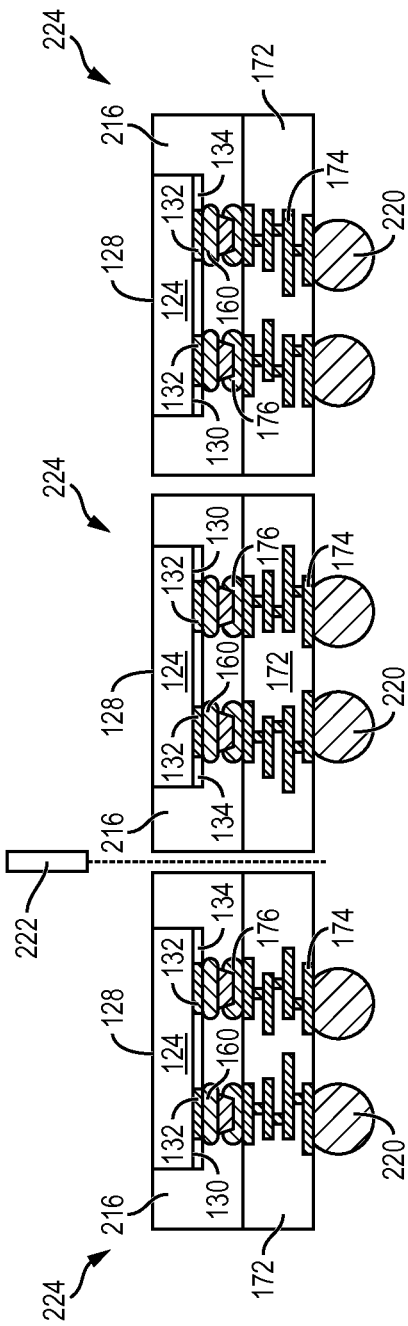

In FIG. 8b, semiconductor die 124 and substrate 170 are removed from chase mold 210. Bumps 220 are formed over conductive layer 174 on a surface of substrate 170 opposite semiconductor die 124. Semiconductor die 124 are singulated through substrate 170 with saw blade or laser cutting tool 222 into individual flipchip packages 224.

Figure 9:
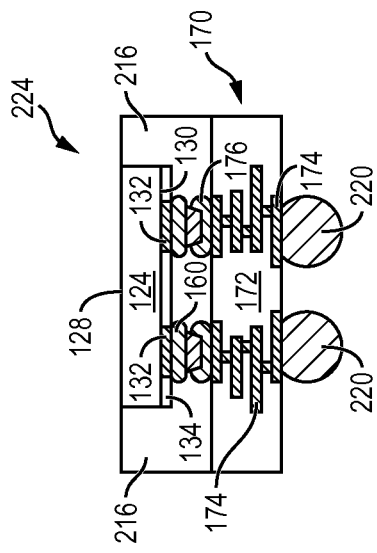
FIG. 9 illustrates a flipchip semiconductor package after singulation from the reconstituted wafer of FIGS. 8a-8b.

FIG. 9 shows flipchip package 224 after singulation. Semiconductor die 124 is electrically connected through stud bumps 160 and bumps 176 to conductive layer 174 and bumps 220 of substrate 170 for external interconnect. The bonding of stud bumps 160 of semiconductor die 124 to bumps 176 of substrate 170 is performed using gang reflow or thermocompression while the semiconductor die are in reconstituted wafer form and attached to carrier 140 and carrier frame 142 (or carrier frame 150 and carrier tape 152) to provide a high throughput of the flipchip type interconnect to the substrate. The flipchip package 224 may undergo inspection and electrical testing before or after singulation.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a plurality of semiconductor die;
    providing a carrier;
    disposing the semiconductor die over the carrier to form a reconstituted wafer;
    forming a plurality of first bumps over the semiconductor die while disposed over the carrier;
    disposing the reconstituted wafer over a substrate panel; and
    reflowing the first bumps to bond the semiconductor die to the substrate panel while disposed over the carrier.

2. The method of claim 1, further including forming a plurality of second bumps over the substrate panel, wherein reflowing the first bumps bonds the first bumps to the second bumps.

3. The method of claim 1, wherein the first bumps include stud bumps.

4. The method of claim 1, further including depositing an encapsulant over the semiconductor die and the substrate panel.

5. The method of claim 1, further including bonding the semiconductor die to the substrate panel using thermocompression.

6. The method of claim 1, further including depositing an underfill material between the semiconductor die and substrate panel.

7. A method of making a semiconductor device, comprising:
    providing a plurality of semiconductor die;
    providing a carrier;
    disposing the semiconductor die over the carrier;
    forming a first bump over the semiconductor die while disposed over the carrier;
    disposing the semiconductor die and carrier over a first surface of a substrate; and
    bonding the first bump to the substrate by reflowing the first bump while the semiconductor die are disposed over the carrier.

8. The method of claim 7, further including forming a second bump over the substrate, wherein bonding the first bump to the substrate includes bonding the first bump to the second bump.

9. The method of claim 7, further including depositing an underfill material between the semiconductor die and substrate.

10. The method of claim 7, further including depositing an encapsulant over the semiconductor die and substrate.

11. The method of claim 7, further including forming a second bump over the substrate.

12. The method of claim 7, further including bonding the first bump to the substrate using thermocompression.

13. The method of claim 7, wherein the first bump includes a stud bump.

14. A method of making a semiconductor device, comprising:
- providing a carrier;
- disposing a plurality of semiconductor die over the carrier;
- forming a plurality of first bumps over the semiconductor die;
- providing a substrate including a plurality of second bumps; and
- bonding the first bumps of the semiconductor die to the second bumps of the substrate while the semiconductor die are disposed over the carrier.

15. The method of claim 14, further including depositing an encapsulant over the semiconductor die and substrate.

16. The method of claim 14, wherein the first bumps include stud bumps.

17. The method of claim 14, wherein the substrate includes a printed circuit board.

18. The method of claim 14, further including thermocompression bonding the first bumps to the second bumps.

19. The of claim 14, further including depositing an underfill material between the semiconductor die and substrate.

20. A method of making a semiconductor device, comprising:
- providing a carrier;
- mounting a plurality of semiconductor die to the carrier;
- forming an electrical interconnect over a surface of the semiconductor die opposite the carrier; and
- disposing a substrate panel over the surface of semiconductor die opposite the carrier after mounting the semiconductor die to the carrier.

21. The method of claim 20, further including:
- bonding the semiconductor die to the substrate panel while disposed over the carrier; and
- removing the carrier.

22. The method of claim 20, further including depositing an encapsulant over the semiconductor die and substrate panel.

23. The method of claim 20, further including forming a bump over the substrate panel.

24. The method of claim 20, further including thermocompression bonding the semiconductor die to the substrate panel.

25. The method of claim 20, wherein the electrical interconnect includes a stud bump.

* * * * *

UNITED STATES PATENT AND TRADEMARK OFFICE
CERTIFICATE OF CORRECTION

PATENT NO. : 9,287,204 B2  Page 1 of 1
APPLICATION NO. : 14/039092
DATED : March 15, 2016
INVENTOR(S) : KyungMoon Kim et al.

It is certified that error appears in the above-identified patent and that said Letters Patent is hereby corrected as shown below:

Claims

Column 13, Line 20, the first line of claim 19 should read:

"The --method-- of claim 14, further including depositing an under-".

Signed and Sealed this
Seventeenth Day of May, 2016

Michelle K. Lee
*Director of the United States Patent and Trademark Office*